(12) United States Patent
Kim et al.

(10) Patent No.: US 7,281,304 B2
(45) Date of Patent: Oct. 16, 2007

(54) METHOD FOR FABRICATING A FILM BULK ACOUSTIC RESONATOR

(75) Inventors: Sang-chae Kim, Suwon-si (KR); In-sang Song, Seoul (KR); Young-tack Hong, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 475 days.

(21) Appl. No.: 10/827,532

(22) Filed: Apr. 20, 2004

(65) Prior Publication Data

US 2005/0034822 A1  Feb. 17, 2005

(30) Foreign Application Priority Data

Apr. 22, 2003 (KR) .................. 10-2003-0025481

(51) Int. Cl.
*H04R 17/00* (2006.01)
*H01L 41/00* (2006.01)

(52) U.S. Cl. .................. 29/25.35; 29/594; 29/846; 29/847; 29/832; 29/830; 29/831; 310/313 R

(58) Field of Classification Search .......... 29/25.35, 29/594, 846, 847, 832, 830, 831; 310/313 R, 310/328, 312, 365, 334; 333/187, 189; 216/75, 216/100, 77–78; 159/5, 17.2; 438/52
See application file for complete search history.

(56) References Cited

U.S. PATENT DOCUMENTS

| 4,107,349 | A |  | 8/1978 | Vig ............................. 427/36 |
| 4,456,850 | A |  | 6/1984 | Inoue et al. |
| 5,162,691 | A |  | 11/1992 | Mariani et al. ............. 310/321 |
| 5,185,589 | A | * | 2/1993 | Krishnaswamy et al. ... 333/133 |
| 5,692,279 | A | * | 12/1997 | Mang et al. ................ 29/25.35 |
| 6,051,907 | A |  | 4/2000 | Ylilammi .................... 310/312 |
| 6,060,818 | A |  | 5/2000 | Ruby et al. ................. 310/363 |
| 6,204,747 | B1 |  | 3/2001 | Kitchens .................... 337/407 |
| 6,242,843 | B1 |  | 6/2001 | Pohjonen et al. ........... 310/313 |
| 6,377,137 | B1 | * | 4/2002 | Ruby ......................... 333/189 |
| 6,384,697 | B1 | * | 5/2002 | Ruby ......................... 333/189 |
| 6,667,182 | B2 |  | 12/2003 | Li et al. |

FOREIGN PATENT DOCUMENTS

| EP | 0 468 796 | 1/1992 |
| EP | 0 963 000 | 12/1999 |
| EP | 0 963 040 | 12/1999 |
| EP | 1 100 196 | 5/2001 |
| EP | 1 473 782 | 11/2004 |
| JP | 58-137317 | 8/1983 |

(Continued)

*Primary Examiner*—A. Dexter Tugbang
*Assistant Examiner*—Tai Van Nguyen
(74) *Attorney, Agent, or Firm*—Lee & Morse, P.C.

(57) ABSTRACT

A method for fabricating a film bulk acoustic resonator (FBAR) includes depositing a dielectric layer on a substrate, providing a sacrificial layer on part of the dielectric layer; providing a bottom electrode on part of the sacrificial layer on part of the dielectric layer; providing a piezoelectric layer on the bottom electrode; patterning a top electrode on the piezoelectric layer; and removing the sacrificial layer. The substrate may have a cavity receiving the sacrificial layer. As a result, a cantilevered resonator having an air gap between the bottom electrode and the dielectric layer may be simply fabricated.

23 Claims, 7 Drawing Sheets

FOREIGN PATENT DOCUMENTS

| | | |
|---|---|---|
| JP | 59-057595 | 4/1984 |
| JP | 61-182286 | 8/1986 |
| JP | 2001-267645 | 9/2001 |
| JP | 2003-017964 | 1/2003 |
| KR | 10-0212566 | 5/1999 |
| KR | 10-2002-0082527 | 10/2002 |
| KR | 10-2003-0013893 | 2/2003 |

* cited by examiner

METHOD FOR FABRICATING A FILM BULK ACOUSTIC RESONATOR

BACKGROUND OF THE INVENTION

1. Field of the Invention

The present invention relates to a method for fabricating a cantilevered type film bulk acoustic resonator and a film bulk acoustic resonator fabricated by the method.

2. Description of the Related Art

As mobile communication devices, such as portable telephones, become increasingly prevalent, demand for compact, lightweight filters used in such devices is also rising. Film bulk acoustic resonators (FBARs) can be used as such compact, lightweight filters. FBARs can be inexpensively mass-produced and can be implemented in a micro-structure. A FBAR has a multi-layer resonance section in which a bottom electrode, a piezoelectric layer, and a top electrode are sequentially provided in this order. The FBAR uses a piezoelectric phenomenon, by which when electric energy is applied to the top and bottom electrodes, piezoelectric effect is produced and resonance results. In such a FBAR, separation between the substrate and the multi-layer resonance section is needed, so that acoustic waves generated from the piezoelectric layer are not affected by the substrate. In a Bragg reflector type FBAR, the separation is achieved using a reflection layer. In an air gap type FBAR, the separation is achieved using an air gap.

The Bragg reflector type FBAR shown in FIG. 1A is a FBAR adapted to generate resonance, in which the FBAR includes a reflection structure 11 deposited on a substrate 10 and a resonator on the reflection structure. The resonator includes a first electrode 12, a piezoelectric material 13 and a second electrode 14. The reflection structure 11 typically includes a plurality of dielectric layers alternating between low impedance and high impedance materials to insure efficient confinement of the acoustic energy in the resonator. Thus, such a Bragg reflector-based FBAR includes a reflection structure 11 having large acoustic impedance difference therebetween disposed in multiple layers on the substrate 10, which induce Bragg reflection to resonate due to acoustic waves between first and second electrodes 12 and 14. However, the precise thickness control of the layers of the reflection structure 11 for the total reflection in such a Bragg reflector type FBAR is not easy and increases the manufacturing cost.

An example of a bulk micro-machined air gap FBAR is shown in FIG. 1B. This membrane-based FBAR includes a silicon oxide layer ($SiO_2$) deposited on a substrate 15 forming a membrane layer 16 on the reverse side of the substrate 15 through a cavity 15' formed by isotropically etching the substrate 15. A resonator includes a first electrode 17 formed on the membrane layer 12, a piezoelectric layer 18 on the lower electrode 17, and an upper electrode layer 19 on the piezoelectric layer 18. However, the fabrication of the membrane is difficult and the devices are frequently damaged during the etching process of substrates thereof.

An example of a surface micro-machined air gap FBAR is shown in FIG. 1C. This surface micro-machined FBAR includes an air gap 25 formed through a sacrificial layer on a substrate 20 using micromachining technologies and has a membrane layer 21. A resonator is provided on top of the membrane layer 21. The resonator includes a first electrode 22, a piezoelectric substance 23, and an second electrode 24. The resonator is formed by providing a sacrificial layer on the substrate 20, fabricating a resonating multi-layer resonance section on the sacrificial layer, and then removing the sacrificial layer through a via hole. However, this fabrication process is complicated, and collapse and peeling off of the structure may result during the process.

An example of a cantilevered type FBAR is shown in FIG. 2. The cantilevered type FBAR includes an abutment 31 on a substrate 30 on which the resonator is formed. The resonator includes a first electrode 32, a piezoelectric material 33 and a second electrode 34. The cantilevered type FBAR may be fabricated by depositing a sacrificial layer, depositing a $SiO_2$ layer to form the abutment 31, sequentially laminating the first electrode 32, the piezoelectric material 33 and the second electrode 34 on the abutment 31, and then etching the sacrificial layer. However, this fabrication process is complicated because the process includes laminating and patterning the $SiO_2$ layer. Further, since the $SiO_2$ layer is positioned under the first electrode 32 as the abutment 31, some acoustic wave energy generated in the piezoelectric layer 33 is absorbed by the $SiO_2$, thereby lowering the quality factor Q (Q-value) of the FBAR.

Further, wire bonding must be used to connect the first and second electrodes 32, 34 in FIG. 2 with external terminals. It is difficult to precisely control the resistance of these connections. Also, the separate connection required for each FBAR do not facilitate using a plurality of FBARs to form a more complex structure, such as a filter.

SUMMARY OF THE INVENTION

The present invention is therefore directed to a film bulk acoustic resonator (FBAR) and a manufacturing method thereof, which substantially overcomes one or more of the problems due to the limitations and disadvantages of the related art.

It is a feature of the present invention to provide a simpler FBAR fabrication. It is another feature of the present invention to prevent a FBAR from being damaged during fabrication. It is yet another feature of the present invention to enhance the Q-value of the FBAR. It is further another feature of the present invention to simplify connection of the electrodes of the FBAR with external terminals.

At least one of the above and other features may be realized by providing a method for fabricating a cantilevered type FBAR including providing a dielectric layer on a substrate, providing a sacrificial layer on a portion of the dielectric layer, while leaving a portion of the dielectric layer exposed to form an exposed dielectric layer, providing a bottom electrode on the sacrificial layer and on the exposed dielectric layer, providing a piezoelectric layer on the bottom electrode, providing a top electrode on the piezoelectric layer, and removing the sacrificial layer.

The method may further include providing a second dielectric layer on the top electrode. The thickness of the second dielectric layer may be adjusted in accordance with a desired resonance frequency.

The providing of the bottom electrode may include depositing a conductive material on the sacrificial layer and on the exposed dielectric layer, the conductive material on the exposed dielectric layer forming a base section and the conductive material on the sacrificial layer forming an overhanging section. The providing of the bottom electrode may further include partially removing the conductive material forming the base section, so that a width of the conductive material forming the base section is smaller than a width of the conductive material forming the overhanging section. The providing of the top electrode may include depositing another conductive material on the piezoelectric layer and on the exposed dielectric layer, and patterning the another conductive material on the dielectric layer so that the top electrode includes a pad positioned in an area of the exposed dielectric layer where the conductive material forming the base section has been removed, the pad being spaced from the conductive material remaining in the base section. The providing of the piezoelectric layer may further include depositing a piezoelectric material on the bottom electrode and on the exposed dielectric layer and patterning the piezoelectric material on the exposed dielectric layer to include a portion of piezoelectric material in an area of the dielectric layer where the conductive material forming the base section has been removed and separate from an area of the dielectric layer in which the pad is to be formed.

The removing of the sacrificial layer may form an air gap between the bottom electrode and the dielectric layer. An upper surface of the sacrificial layer may be higher than an upper surface of the dielectric layer. The method may further include, prior to the providing of the dielectric layer, forming a cavity on the substrate. The providing of the sacrificial layer may include filling the cavity with a sacrificial material. The filling of the cavity may include depositing the sacrificial material on the dielectric layer and the cavity and planarizing the sacrificial layer to expose a portion of the dielectric layer. The planarizing may include a chemical mechanical polishing process.

At least one of the above and other features may be realized by providing a FBAR including a substrate, a dielectric layer on the substrate, a bottom electrode on the dielectric layer, a piezoelectric layer on the bottom electrode, and a top electrode on the piezoelectric layer. The bottom electrode has a base section and an overhanging section. The overhanging section extends over an air gap between the bottom electrode and the dielectric layer.

The FBAR may include a second dielectric layer on the top electrode. The base section of the bottom electrode may have a width that is smaller than a width of the overhanging section of the bottom electrode. The top electrode may extend down to the dielectric layer in an area spaced from the base section, thereby forming a pad. The piezoelectric layer may extend down to the dielectric layer in an area spaced from the pad.

The substrate may have a cavity, with the overhanging section of the bottom electrode being over the cavity. The dielectric layer or the bottom electrode may be substantially planar. An upper surface of the overhanging section of the bottom electrode may be higher than an upper surface of the base section of the bottom electrode. The piezoelectric layer may extend over the overhanging section and over part of the base section of the bottom electrode.

BRIEF DESCRIPTION OF THE DRAWINGS

The above and other aspects, features and advantages of the present invention will be more apparent to those of ordinary skill in the art from the following detailed description taken with reference to the accompanying drawings, in which.

DETAILED DESCRIPTION

Figure 1A:
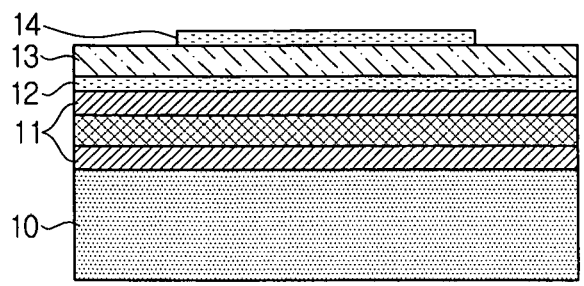
FIG. 1A illustrates a cross-section of a Bragg reflector type FBAR.
Figure 1B:
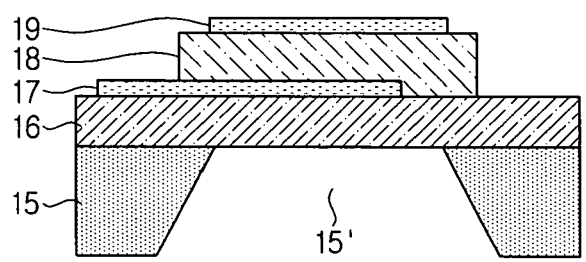
FIG. 1B illustrates a cross-section of a bulk micromachined FBAR.
Figure 1C:
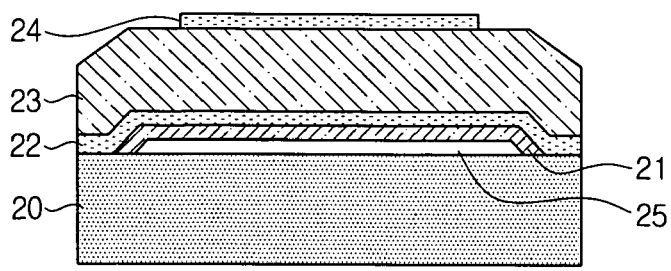
FIG. 1C illustrates a cross-section of a surface micromachined FBAR.

Korean Patent Application No. 2003-25481, filed on Apr. 22, 2003, in the Korean Intellectual Property Office, and entitled "METHOD FOR FABRICATING CANTILEVERED FILM BULK ACOUSTIC RESONATOR AND CANTILEVERED FILM BULK ACOUSTIC RESONATOR FABRICATED BY THE SAME," is incorporated herein by reference in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it may be directly on the other layer or substrate, or intervening layers may also be present. Further, it will be understood that when a layer is referred to as being "under" another layer, it may be directly under, or one or more intervening layers may also be present. In addition, it will also be understood that when a layer is referred to as being "between" two layers, it may be the only layer between the two layers, or one or more intervening layers may also be present. Like numbers refer to like elements throughout As used herein, "cantilevered" refers to a structure being supported on one end, but not on the other, i.e., composed of a base section and an overhanging section. A method for fabricating a cantilevered type FBAR according to a first embodiment of the present invention generally includes providing a bottom electrode having a base section on an exposed dielectric layer and having an overhanging section on a sacrificial layer, where the sacrificial layer is higher than the exposed dielectric layer. The rest of the resonator is built on the bottom electrode and then the sacrificial layer is removed to provide the air gap. A method for fabricating a cantilevered type FBAR according to a second embodiment of the present invention generally includes forming a cavity on an upper surface of a substrate, providing a dielectric layer on the substrate, filling the cavity with a sacrificial layer, and providing a bottom electrode having a base section on an exposed dielectric layer and having an overhanging section on the sacrificial layer. The rest of the resonator is built on the bottom electrode and then the sacrificial layer is removed from the cavity to provide the air gap. The details of both these FBARs and their respective methods are provided below.

Figure 3A:
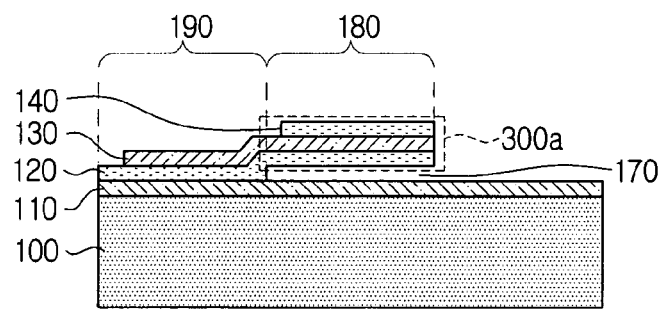
FIGS. 3A and 3B illustrate resultant cross-sections of FBARs each fabricated according to a first embodiment of the present invention.
Figure 3B:
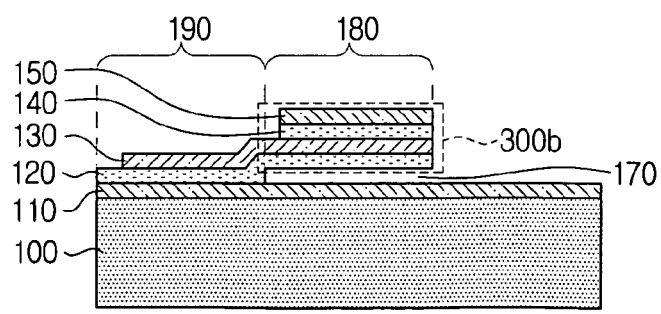

FIGS. 3A and 3B show the final structure of the cantilevered type FBARs fabricated according to a first embodiment of the present invention. FIGS. 4A to 4F show the respective steps of the process for fabricating such a cantilevered type FBAR. The FBAR of FIG. 3B requires the additional step shown in FIG. 4G.

Figure 4A:
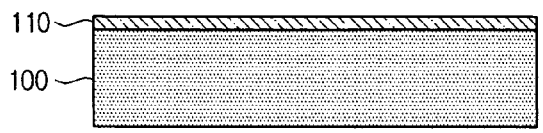
FIGS. 4A-4F illustrate cross-sections at various stages in a process for fabricating a FBAR according to the first embodiment of the present invention, with FIG. 4G illustrating an optional additional step.

First, as shown in FIG. 4A, a dielectric layer 110 is deposited on a substrate 100. The dielectric layer 110 serves to isolate the substrate 100 and an electrode layer 120 from each other and to facilitate the deposition of the electrode layer 120. The substrate 100 may be a typical silicone wafer, e.g., a high resistance silicon (HRS) substrate. The dielectric layer 110 may be, for example, silicone oxide ($SiO_2$) or aluminum oxide ($Al_2O_3$).

Figure 4B:
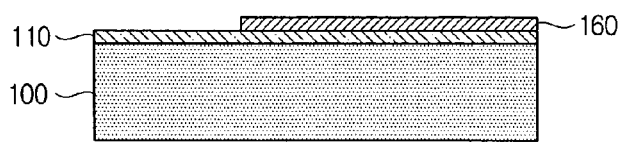

Next, as shown in FIG. 4B a sacrificial layer 160 is deposited and patterned on the dielectric layer 110. Through the patterning, the sacrificial layer 160 is removed or is otherwise not present in the area where the bottom electrode 120 will adjoin the dielectric layer 110, as described below with reference to FIG. 4C. The sacrificial layer 160 may be a readily removable material, since the sacrificial layer 160 is to be removed later to form an air gap 170. For example, if etching is to be used for the removal of the sacrificial layer, the sacrificial layer may be magnesium oxide (MgO) or zinc oxide (ZnO). Because the thickness of the sacrificial layer 160 is to be the depth of the air gap 170, the thickness of the sacrificial layer 160 may be adjusted to control the size of the air gap 170. Here, part of the dielectric layer 110 remains exposed, i.e., is not covered by the sacrificial layer 160, and an upper surface of the sacrificial layer 160 is higher than an upper surface of the dielectric layer 110.

Figure 4C:
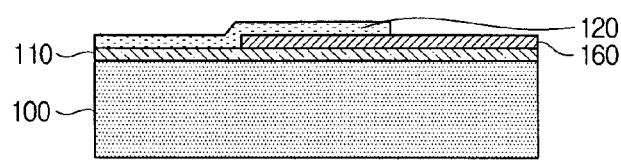

As shown in FIG. 4C, the electrode 120 is deposited and patterned both on a part where the sacrificial layer 160 has been removed, i.e., the exposed first dielectric layer part, and on a part of the sacrificial layer 160. The bottom electrode layer 120 deposited on the remaining sacrificial layer 160 will form an overhanging section 180 of the cantilever, i.e., the part of the cantilever over an air gap. The bottom electrode layer 120 deposited on the first dielectric layer 110 will form a base section 190 of the cantilever. Here, a portion of the bottom electrode forming the overhanging section 180 is higher than a portion of the bottom electrode forming the base section 190. The bottom electrode 120 may be any conventional conductive material such as metal. For example, the bottom electrode 120 may be aluminum (Al), tungsten (W), gold (Au), platinum (Pt), nickel (Ni), titanium (Ti), chromium (Cr), palladium (Pd) and molybdenum (Mo). Any appropriate sputtering and evaporation methods, or other suitable techniques, may be used for the deposition.

Figure 4D:
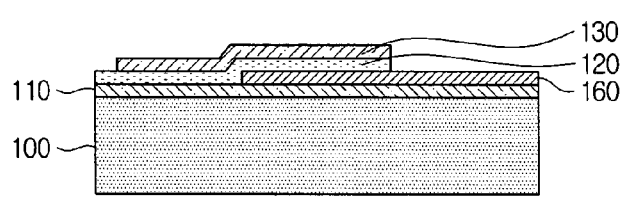

As shown in FIG. 4D, a piezoelectric layer 130 is deposited and patterned on the bottom electrode 120. The piezoelectric layer 130 may be patterned to leave a predetermined part thereof, so that its rigidity can be maintained without an abutment as in the prior art FBAR shown in FIG. 2. The piezoelectric layer 130 generates piezoelectric phenomenon, wherein an electric field applied to the piezoelectric layer 130 is converted into mechanical energy in the form of an acoustic wave. The piezoelectric layer 130 may be, for example, aluminum nitride (AlN) or zinc oxide (ZnO). The piezoelectric layer 130 may be deposited using RF magnetron sputtering method.

Figure 4E:
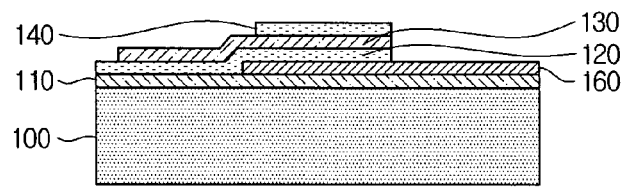

As shown in FIG. 4E, a top electrode 140 is deposited and patterned on the piezoelectric layer. The top electrode 140 may be patterned so that it overlaps the bottom electrode 120 within the area where the air gap 170 will be formed, i.e., over the sacrificial layer 160. The piezoelectric layer 130 between the top electrode 140 and the bottom electrode 120 forms the resonator of the FBAR. The top electrode 140 can be formed from a material that is either identical to or different from that used for the bottom electrode 120.

Figure 4F:
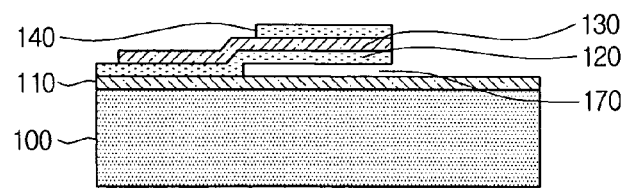

As shown in FIG. 4F, the sacrificial layer 160 is removed to form the air gap 170. The sacrificial layer 160 may be removed using etching, e.g., using wet etching or dry etching. Wet etching may be performed using a chemical solution, such as aqueous acetic acid solution, hydrofluoric acid, aqueous phosphoric acid, etc. Dry etching may be performed using gas, plasma, ion beam, etc. These etching methods may be also used in patterning respective layers in the previous steps.

After passing through the above steps, a cantilevered type FBAR as shown in FIG. 3A is created. The FBAR of FIG. 3A includes the dielectric layer 110 on the substrate 100, and a cantilever structure having a base section 190 and an overhanging section 180 on the dielectric layer 110. The dielectric layer 110 is substantially planar. The bottom electrode 120 defines the extent of both the base section 190 and the overhanging section 180. The piezoelectric layer 130 is over the entire overhanging section 180 and part of the base section 190. The top electrode 140 is on the piezoelectric layer 130 over the overhanging section 180. Consequently, the overhanging section 180 has a structure with the bottom electrode 120, the piezoelectric layer 130 and the top electrode 140 are sequentially provided. The base section 190 has a structure with just the bottom electrode 120 and the piezoelectric layer 130. When an electric field is applied to the top and bottom electrodes, the overhanging section 180 serves as a resonance section 300a.

Hereinbelow, the operating principle of the cantilevered type FBAR is described with reference to FIG. 3A. As shown in FIG. 3A, the resonance section 300a consists of the top and bottom electrodes 120, 140 and the piezoelectric layer 130 interposed therebetween. When an electric field is applied to the top and bottom electrodes 120, 140, the piezoelectric layer 130 generates piezoelectric effect that converts electric energy into mechanical energy in the form of an acoustic wave. Meanwhile, the air gap 170 separates the resonance section 300a and the substrate 100, thereby preventing the acoustic wave generated in the resonance section 300a from being affected by the substrate 100.

Figure 2:
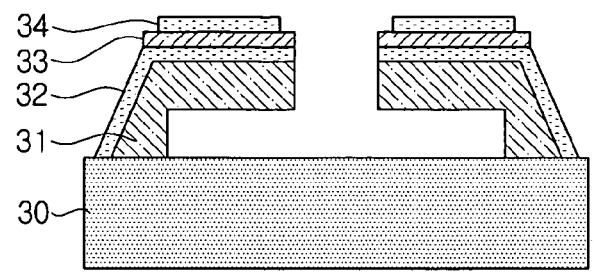
FIG. 2 illustrates a cross-section of a cantilevered type FBAR.

Referring to the structure of the FBAR shown in FIG. 2, to be referred to as a "conventional FBAR", as discussed above in the Description of Related Art, the cantilevered type abutment 31 is formed of silicon dioxide ($SiO_2$) and the bottom electrode 32, the piezoelectric layer 33 and the top electrode 34 are sequentially laminated on the overhanging section of this abutment 31. With this construction, the Q-value may be decreased, since the abutment 31 may absorb the acoustic wave generated in the piezoelectric layer 33.

In contrast, according to the present invention, the bottom electrode 120 defines the cantilever without any additional abutment element. That is, the resonance section 300a of the present invention is distinguished from that of the conventional FBAR in construction in that it has only the bottom electrode 120, the piezoelectric layer 130 and the top electrode 140, without any other unnecessary structure. Thus, the FBAR of the present invention has a relatively high Q-value, since there is nothing in the resonance section 300a to absorb acoustic waves.

In addition, in the conventional FBAR, the piezoelectric is deposited only on the overhanging section. Therefore, if the $SiO_2$ abutment is not formed, the resulting FBAR lacks rigidity, since only the bottom electrode remains to support the structure. In contrast, according to the present invention, because the piezoelectric layer 130 may be deposited on part of the base section 190 beyond the overhanging section 180, the piezoelectric layer can maintain the rigidity without any separate abutment.

These constructional differences lead to differences in the manufacturing process. Because the present invention does not require the step for forming an abutment, the manufacturing process of the present invention can be simpler than that of the conventional FBAR.

Figure 4G:
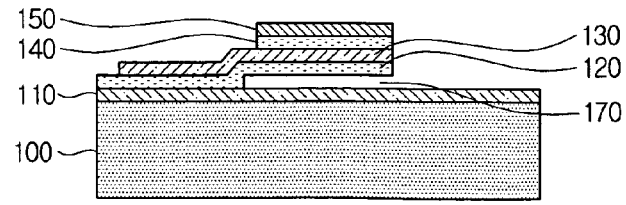

The rigidity of the FBAR fabricated according to the present invention may be increased by depositing a second dielectric layer 150 on the top electrode 140, as shown in FIG. 4G. The resultant structure shown in FIG. 3B includes a resonance section 300b. The resonance section 300b may be frequency-tuned by controlling a depth of the second dielectric layer 150 to adjust the thickness of the resonance section 300b. That is, resonance frequency $f_0$ is approximated by equation, $f_0=v/2d$, wherein v is velocity of acoustic wave in the piezoelectric layer and d is the thickness of the resonance section. Thus, if the thickness d is adjusted by controlling the depth of the second dielectric layer 150, the resonance frequency of the resonator section 300b can be tuned. Any known method of controlling this thickness, e.g., etching, may be used.

Figure 5A:
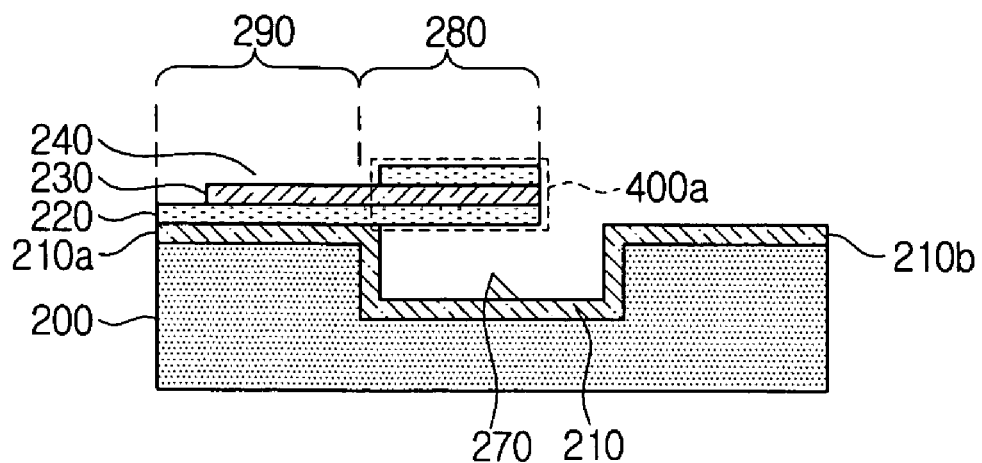
FIGS. 5A and 5B illustrate resultant cross-sections of FBARs each fabricated according to the a second embodiment of the present invention.
Figure 5B:
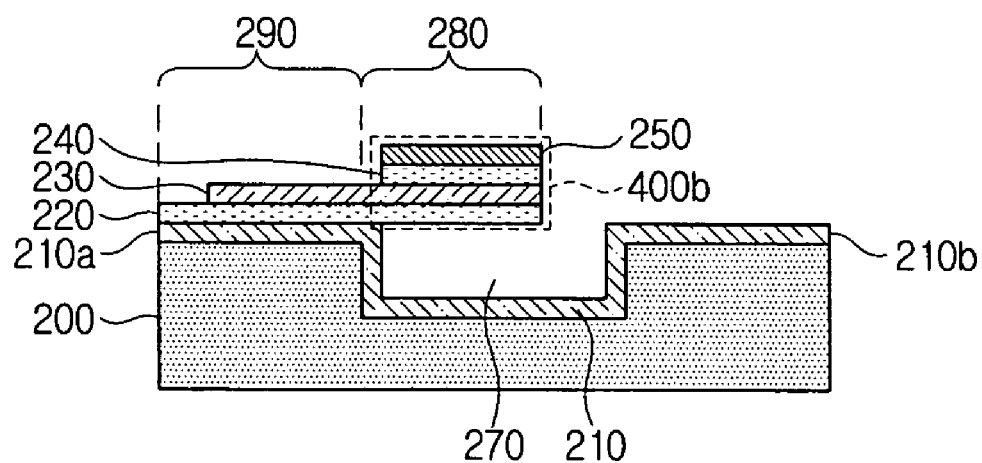

FIGS. 5A and 5B show a cantilevered type FBAR fabricated according to the second embodiment present invention. FIGS. 6A to 6G show the respective steps of the fabricating process of the cantilevered type FBAR in accordance with the second embodiment. An additional step shown in FIG. 6H is needed for the FBAR shown in FIG. 5B.

Since the steps shown in FIGS. 6E-6H are substantially the same as those described above with reference to FIGS. 4D-4G, respectively, a detailed description thereof will be omitted. Hereinbelow, the steps shown in FIGS. 6A-6D will be described in detail.

Figure 6A:
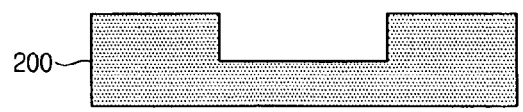
FIGS. 6A-6G illustrate cross-sections at various stages in a process for fabricating an FBAR according to the second embodiment of the present invention, with FIG. 6H illustrating an optional additional step.

First, as shown in FIG. 6A, a cavity 270 is created in a substrate 200. Such creation may be realized by etching the substrate 200 that has been patterned with a photoresist. The substrate 200 may be etched by using wet etching or dry etching method as described above. While exaggerated herein for clarity, the cavity 270 is not required to have a large depth because it serves separate the substrate 200 and resonance section of the FBAR to be formed thereon. A depth on the order of several microns (about 3 μm to 5 μm) may be sufficient.

Figure 6B:
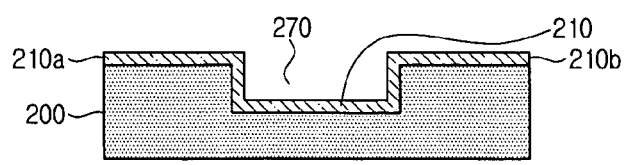

Next, as shown in FIG. 6B, a dielectric layer 210a, 210, 210b is provided on the substrate 200 having the cavity 270. The dielectric layer 210a, 210, 210b is deposited to isolate a bottom electrode 220, as discussed below with reference to FIG. 6D, and the substrate 200 from each other. The dielectric layer may also serve as an etching mask at the time of removing a sacrificial layer.

Figure 6C:
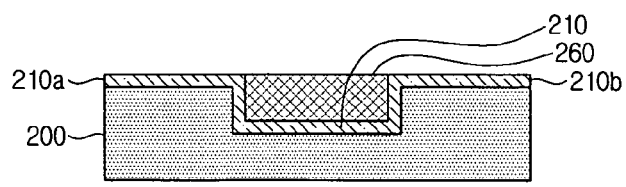

As shown in FIG. 6C, a sacrificial layer 260 is deposited on the dielectric layer 210a, 210, 210b and then planarized so that the dielectric layer parts 210a, 210b, but not the dielectric layer part 210 deposited in the cavity 270, are exposed. That is, if the sacrificial layer is deposited on the parts on the top of the dielectric layer parts 210a, 210b while filling the cavity 270, the sacrificial layer is removed so that the dielectric layer parts 210a, 210b are exposed. Because the bottom electrode 220 is to be deposited later on one of the dielectric layer parts 210a, 210b, the sacrificial layer 260 on the dielectric layer parts 210a, 210b must be removed. Conventional planarization methods include reflow and spin-on-glass (SOG) spin coating. However, as the depth of focus realizable by lithography equipment is reduced, a higher degree of planarization may be required. Therefore, a chemical mechanical polishing (CMP) method may be used for the planarization.

Figure 6D:
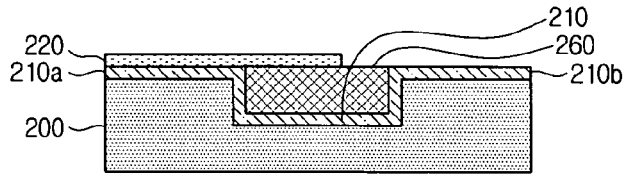

As shown in FIG. 6D, the bottom electrode 220 is deposited on a part 210a of the dielectric layer and on a part of the planarized sacrificial layer 260. That is, the bottom electrode 220 is formed to have a portion adjoining a part 210a of the dielectric layer and a part of the sacrificial layer 260. Unlike the raised shape of the bottom electrode 120 of the first embodiment, the bottom electrode 220 is flat, i.e., substantially planar. However, because the substrate includes the cavity 270 below the bottom electrode part over the sacrificial layer 260, a cantilevered structure is still realized once the sacrificial layer 260 is removed. The bottom electrode 220 may be made using any materials discussed above regarding the bottom electrode 120 in the cantilevered type FBAR of the first embodiment.

Figure 6E:
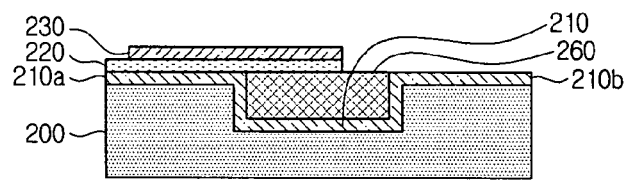
Figure 6F:
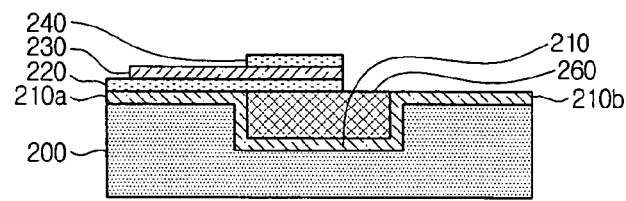
Figure 6G:
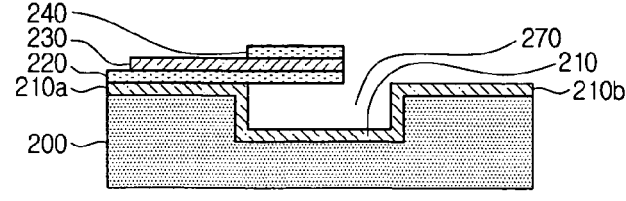
Figure 6H:
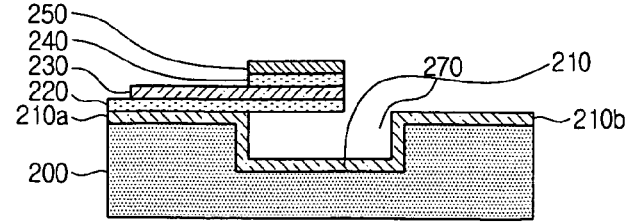

As shown in FIGS. 6E-6F, a piezoelectric layer 230 and a top electrode 240 are created in sequence to form a resonance section 400a. As shown in FIG. 6G, the sacrificial layer 260 is removed to provide the air-gap in the cavity 270. The details and materials for these steps may be found above regarding FIGS. 4D-4F.

As shown in FIG. 6H, in fabricating a cantilevered type FBAR of the second embodiment, just as for the fabrication of cantilevered type FBAR of the first embodiment, it is of course possible to additionally deposit and to pattern a second dielectric layer 250 on the top electrode 240. This second dielectric layer 250 provides the same advantages of reinforced rigidity and potential for frequency tuning as the second dielectric layer 150 discussed above.

FIGS. 5A and 5B illustrate the final structures of the cantilevered type FBAR fabricated according to the second embodiment of the present invention. The FBAR has a cavity 270 at a predetermined area of the substrate 200, and a dielectric layer 210a, 210, 210b on the substrate having the cavity 270. The bottom electrode 220 overlaps the part 210a of the dielectric layer, thereby forming a base section 290. The bottom electrode 220 extends over the cavity 270, thereby forming an overhanging section 280. The piezoelectric layer 230 is provided over the entire overhanging section 280 and over part of the base section 290. The top electrode 240 is provided on the piezoelectric layer 230 on the overhanging section 280, thereby forming a resonance section 400a.

The FBAR shown in FIG. 5B has an additional dielectric layer 250 deposited on the top electrode 240, thereby reinforcing the rigidity of a resonance section 400b. The thickness of the second dielectric layer 250 on the resonance section 400b maybe controlled to adjust the thickness of the resonance section 400b, thereby tuning the resonance frequency of the resonance section 400b.

Figure 7A:
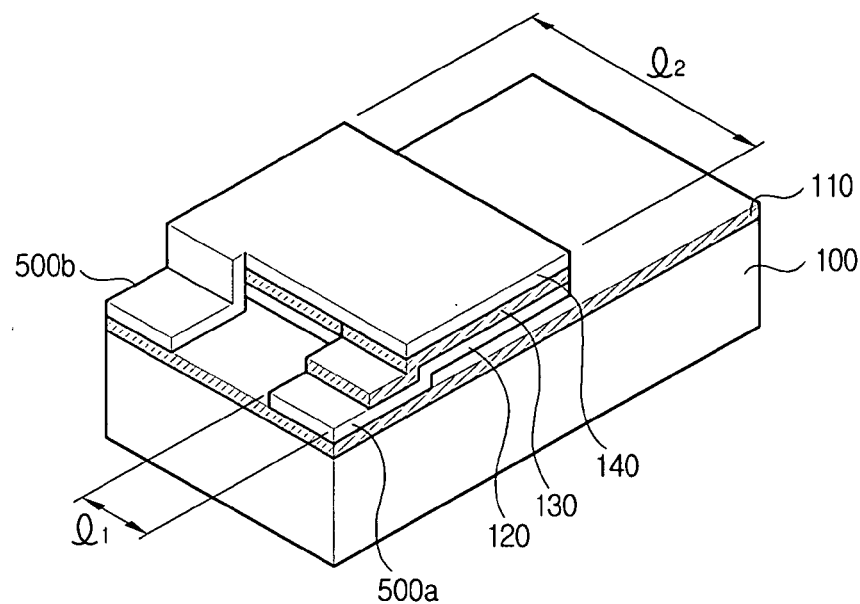
FIG. 7A illustrates a perspective view of a FBAR fabricated according to third embodiment of the present invention.
Figure 7B:
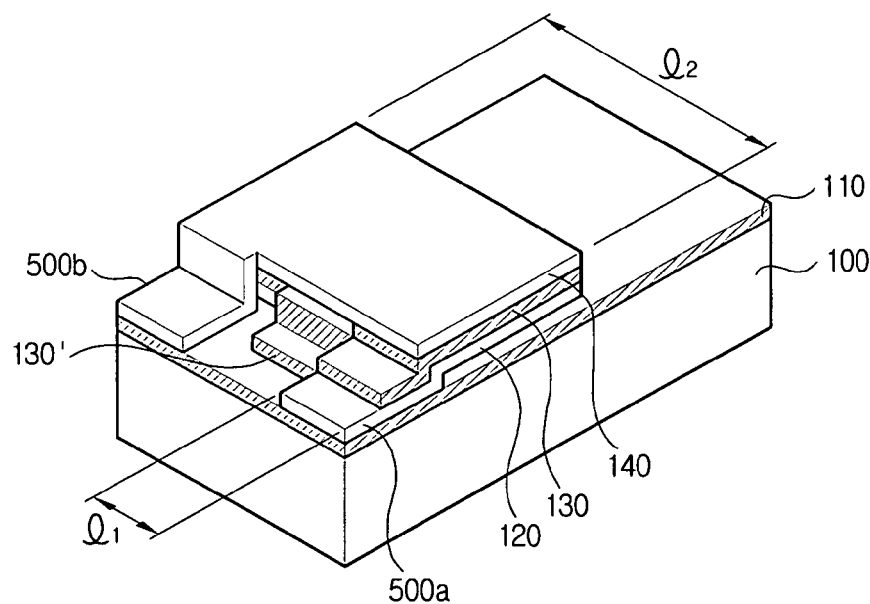
FIG. 7B illustrates a perspective view of a FBAR fabricated according to a fourth embodiment of the present invention.
Figure 7C:
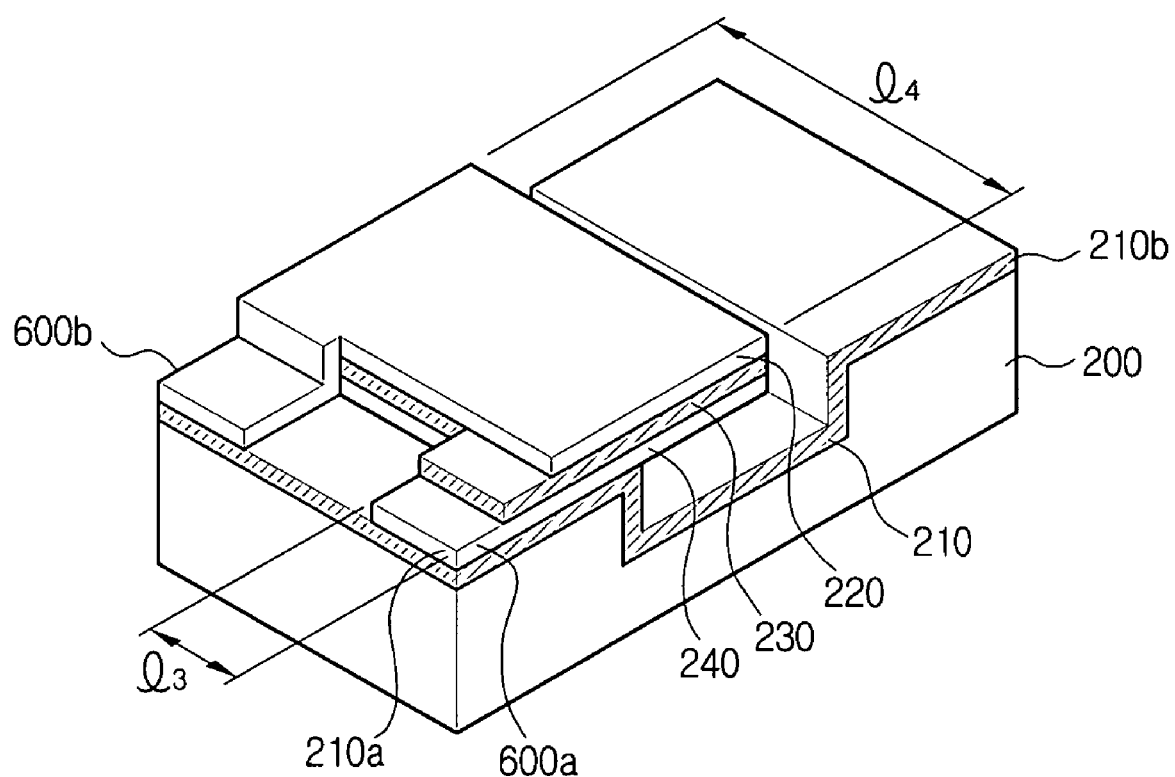
FIG. 7C illustrates a perspective view of a FBAR fabricated according to a fifth embodiment of the present invention.

FIGS. 7A-7C are directed to providing the above FBARs with simplified electrical connections of the top and bottom electrodes to external terminals. In the conventional FBAR described above with reference to FIG. 2, the top and bottom electrodes are connected with external terminals by wire bonding (not shown in the drawing). However, because wire bonding has a number of problems as described above, such wire bonding is desirably avoided. If pads are formed as shown in FIGS. 7A-7C, electrodes of each FBAR may be connected in one-step when a plurality of FBARs are employed to form a filter According to a third embodiment of the present invention, as shown in FIG. 7A, after depositing the bottom electrode 120 on the sacrificial layer 160 and the dielectric layer 110, as shown in FIG. 4C, a part of the bottom electrode 120 forming the base section 190 is removed so that the width $l_1$ of the bottom electrode 120 forming the base section 190 is smaller than the width $l_2$ of the bottom electrode 120 forming the overhanging section 180. After depositing the top electrode 140 on the piezoelectric layer 130, as shown in FIG. 4E, the top electrode 140 is patterned so that the top electrode 140 is positioned in the area of the dielectric layer 110, where the bottom electrode has been removed, and spaced from the part of the bottom electrode 120 left in the base section 190. Thus, pads 500a, 500b for connecting the top and bottom electrodes with external terminals, respectively, may be formed.

As shown in FIG. 7A, in creating the pads 500a, 500b, the piezoelectric layer 130 no longer extends in the base section 190. This extension of the piezoelectric layer 130 in the first embodiment aided in rigidity of the FBAR. According to the fourth embodiment of the present invention, shown in FIG. 7B, a more rigid cantilevered type FBAR may be formed by leaving a portion 130' of the piezoelectric layer 130 in an area between pad 500a of the bottom electrode and pad 500b of the top electrode, while still allowing for easy electrical connection.

According to the fifth embodiment of the present invention, shown in FIG. 7C, after depositing the bottom electrode 220 on the part 210a of the dielectric layer and planarized sacrificial layer 260, shown in FIG. 6D, part of the bottom electrode 220 forming the base section 290 is removed, so that the width $l_3$ of the bottom electrode 220 forming the base section 290 is smaller than the width $l_4$ of the bottom electrode 220 forming the overhanging section 280. After depositing the top electrode 240 on the piezoelectric layer 230, as shown in FIG. 6F, the top electrode 240 is patterned, so that the top electrode is positioned in the area of the dielectric layer 220, where the bottom electrode has been removed, and spaced from the part of the bottom electrode 220 left in the base section 290. Thus, it is possible to form pads 600a, 600b to be connected with external terminals as shown in FIG. 7C.

The increased rigidity of FIG. 7B may be similarly realized with the configuration of FIG. 7C. Further, the additional dielectric layer on the top electrode, as shown in FIGS. 3B and 5B, may be used in any of FIGS. 7A-7C.

A FBAR of the present invention may be integrated with a complementary metal dioxide semiconductor (CMOS), by fabricating the CMOS on a substrate and then fabricating the FBAR according to the either embodiment of the present invention. Since the fabrication of the FBAR in accordance with the present invention uses equipment and processes for fabricating CMOSs, the inventive fabrication processes are compatible with existing fabrication processes for the CMOS.

According to the present invention, an air gap FBAR having a superior reflection characteristic, a stable effective bandwidth, and a rigid structure may be simply fabricated. This is in contrast to existing FBAR fabrication processes, in which the processes themselves are complicated and devices are frequently damaged, resulting in low yields.

In addition, since the present invention eliminates the need for the abutment of FIG. 2 and the loss attendant thereto, the quality factor Q can be improved.

In addition, the rigidity of the FBAR may be readily reinforced by providing a dielectric layer on the top electrode of the FBAR. Further, controlling the thickness of the top dielectric layer allows frequency tuning to be easily performed.

A FBAR fabricated according to the present invention has a high quality factor, i.e., a high Q, and enables implementation of a filter to be capable of being used in a micro frequency band. In addition, the FBAR can be used in a duplexer that differentiates a receiver signal and a transmitter signal using two band-pass filters in a communication system. When implementing a filter, the inventive FBAR may be easily frequency-tuned by a method such as controlling the thickness the top dielectric layer.

Embodiments of the present invention have been disclosed herein and, although specific terms are employed, they are used and are to be interpreted in a generic and descriptive sense only and not for purpose of limitation. For example, the cavity on the substrate may be in a layer of material on the substrate, rather than in the substrate itself. Accordingly, it will be understood by those of ordinary skill in the art that various changes in form and details may be made without departing from the spirit and scope of the present invention as set forth in the following claims.

What is claimed is:

1. A method for fabricating a film bulk acoustic resonator, the method comprising:
   providing a dielectric layer on a substrate;
   providing a sacrificial layer on a portion of the dielectric layer, while leaving a portion of the dielectric layer exposed to form an exposed dielectric layer;
   providing a bottom electrode on the sacrificial layer and on the exposed dielectric layer, the providing of the bottom electrode including depositing a conductive material on the sacrificial layer and on the exposed dielectric layer, the conductive material on the exposed dielectric layer forming a base section and the conductive material on the sacrificial layer forming an overhanging section;
   providing a piezoelectric layer on the bottom electrode;
   providing a top electrode on the piezoelectric layer; and
   removing the sacrificial layer.

2. The method as claimed in claim 1, further comprising providing a second dielectric layer on the top electrode.

3. The method as claimed in claim 2, further comprising adjusting a thickness of the second dielectric layer in accordance with a desired resonance frequency.

4. The method as claimed in claim 1, wherein the providing of the bottom electrode further includes partially removing the conductive material forming the base section, so that a width of the conductive material forming the base section is smaller than a width of the conductive material forming the overhanging section; and
   wherein the providing of the top electrode includes depositing another conductive material on the piezoelectric layer and on the exposed dielectric layer, and patterning the another conductive material on the dielectric layer so that the top electrode includes a pad positioned in an area of the exposed dielectric layer where the conductive material forming the base section has been removed, the pad being spaced from the conductive material remaining in the base section.

5. The method as claimed in claim 4, wherein the providing of the piezoelectric layer further includes depositing a piezoelectric material on the bottom electrode and on the exposed dielectric layer and patterning the piezoelectric material on the exposed dielectric layer to include a portion of piezoelectric material in an area of the exposed dielectric layer where the conductive material forming the base section has been removed and separate from an area of the dielectric layer in which the pad is to be formed.

6. The method as claimed in claim 1, wherein the removing of the sacrificial layer forms an air gap between the bottom electrode and the dielectric layer.

7. The method as claimed in claim 1, wherein an upper surface of the sacrificial layer is higher than an upper surface of the dielectric layer.

8. A method for fabricating a film bulk acoustic resonator, the method comprising:
    forming a cavity on a substrate;
    providing a dielectric layer on the substrate;
    providing a sacrificial layer on a portion of the dielectric layer, while leaving a portion of the dielectric layer exposed to form an exposed dielectric layer;
    providing a bottom electrode on the sacrificial layer and on the exposed dielectric layer.
    providing a piezoelectric layer on the bottom electrode;
    providing a top electrode on the piezoelectric layer; and
    removing the sacrificial layer,
    wherein the providing of the bottom electrode includes depositing a conductive material on the exposed dielectric layer to form a base section and on the sacrificial layer to form an overhanging section, and partially removing the conductive material forming the base section, so that a width of the conductive material forming the base section is smaller than a width of the conductive material forming the overhanging section; and
    the providing of the top electrode includes depositing another conductive material on the piezoelectric layer and on the exposed dielectric layer, and patterning the another conductive material so that the top electrode includes a pad positioned on the exposed dielectric layer where the conductive material forming the base section has been removed, the pad being spaced from the conductive material forming the base section.

9. The method as claimed in claim 8, wherein the providing of the sacrificial layer includes filling the cavity with a sacrificial material.

10. The method as claimed in claim 9, wherein the filling of the cavity includes depositing the sacrificial material on the dielectric layer and the cavity and planarizing the sacrificial material to provide the exposed dielectric layer.

11. The method as claimed in claim 10, wherein the planarizing includes a chemical mechanical polishing process.

12. The method as claimed in claim 8, further comprising providing a second dielectric layer on the top electrode.

13. The method as claimed in claim 12, further comprising adjusting a thickness of the second dielectric layer in accordance with a desired resonance frequency.

14. A method for fabricating a film bulk acoustic resonator, the method comprising:
    providing a dielectric layer on a substrate;
    providing a sacrificial layer on a portion of the dielectric layer, while leaving another portion of the dielectric layer exposed to form an exposed dielectric layer;
    providing a bottom electrode on a portion of the sacrificial layer and on the exposed dielectric layer;
    providing a piezoelectric layer on the bottom electrode;
    providing a top electrode on the piezoelectric layer; and
    removing the sacrificial layer.

15. The method as claimed in claim 14, further comprising providing a second dielectric layer on the top electrode.

16. The method as claimed in claim 15, further comprising adjusting a thickness of the second dielectric layer in accordance with a desired resonance frequency.

17. The method as claimed in claim 14, wherein the providing of the bottom electrode includes depositing a conductive material on the sacrificial layer and on the exposed dielectric layer, the conductive material on the exposed dielectric layer forming a base section and the conductive material on the sacrificial layer forming an overhanging section.

18. The method as claimed in claim 17, wherein the providing of the bottom electrode further includes partially removing the conductive material forming the base section, so that a width of the conductive material forming the base section is smaller than a width of the conductive material forming the overhanging section; and
    wherein the providing of the top electrode includes depositing another conductive material on the piezoelectric layer and on the exposed dielectric layer, and patterning the another conductive material on the dielectric layer so that the top electrode includes a pad positioned in an area of the exposed dielectric layer where the conductive material forming the base section has been removed, the pad being spaced from the conductive material remaining in the base section.

19. The method as claimed in claim 18, wherein the providing of the piezoelectric layer further includes depositing a piezoelectric material on the bottom electrode and on the exposed dielectric layer and patterning the piezoelectric material on the exposed dielectric layer to include a portion of piezoelectric material in an area of the exposed dielectric layer where the conductive material forming the base section has been removed and separate from an area of the dielectric layer in which the pad is to be formed.

20. The method as claimed in claim 14, wherein the removing of the sacrificial layer forms an air gap between the bottom electrode and the dielectric layer.

21. The method as claimed in claim 14, wherein an upper surface of the sacrificial layer is higher than an upper surface of the dielectric layer.

22. The method as claimed in claim 14, further comprising, before the providing of the dielectric layer, forming a cavity on the substrate.

23. The method as claimed in claim 22, wherein the providing of the sacrificial layer includes filling the cavity with a sacrificial material.

* * * * *